United States Patent [19]

Oohashi et al.

[11] Patent Number: 4,818,892
[45] Date of Patent: Apr. 4, 1989

[54] LASER DEVICE WITH HIGH-VOLTAGE PULSE GENERATOR, HIGH-VOLTAGE PULSE GENERATOR AND PULSE GENERATING METHOD

[75] Inventors: Tuneyoshi Oohashi, Hitachiota; Satoshi Takemori, Hitachi; Toshimichi Kichikawa, Hitachi; Kouji Kuwabara, Hitachi; Hiroyuki Sugawara, Hitachi, all of Japan

[73] Assignee: Hitachi, Ltd., Tokyo, Japan

[21] Appl. No.: 101,171

[22] Filed: Sep. 25, 1987

[30] Foreign Application Priority Data

Sep. 26, 1986 [JP] Japan .................................. 62-226029
Mar. 27, 1987 [JP] Japan .................................. 61-71534

[51] Int. Cl.$^4$ ........................ H03K 3/02; G11C 13/02
[52] U.S. Cl. ................................ 307/106; 307/108; 307/415; 307/417; 307/83; 363/133; 363/134
[58] Field of Search ................. 307/105–110, 307/408–420; 323/241, 290, 272, 279; 336/213, 218, 219, 84 R, 84 C, 177, 62, 229, 212, 171, 12; 328/65, 67; 363/133, 134, 132, 24, 25, 26

[56] References Cited

U.S. PATENT DOCUMENTS

| | | | |
|---|---|---|---|
| 2,990,539 | 6/1961 | Mackay et al. | 307/417 X |
| 4,424,459 | 1/1984 | Inomata et al. | 307/415 |
| 4,549,091 | 10/1985 | Fahlen et al. | 307/415 X |
| 4,595,843 | 6/1986 | Del Vecchio et al. | 336/184 X |
| 4,652,771 | 3/1987 | Specht et al. | 307/83 |
| 4,684,820 | 8/1987 | Valencia | 307/108 X |
| 4,694,387 | 9/1987 | Walker | 363/133 X |
| 4,707,619 | 11/1987 | Chu et al. | 307/415 X |

Primary Examiner—William M. Shoop, Jr.
Assistant Examiner—Paul Ip
Attorney, Agent, or Firm—Antonelli, Terry & Wands

[57] ABSTRACT

A laser device equipped with a high-voltage pulse generator wherein the pulse generator supplies an electric energy from a dc power source in an on-off form of a supply voltage to a tank circuit through a transformer, with the switching on and off of the supply voltage being effected in synchronism with the resonance period of the tank circuit. The tank circuit stores the supplied electric energy as a resonance condition so that when the electric energy stored in the tank circuit reaches a predetermined value, a saturable reactor connected between the laser device and the tank circuit becomes saturated and the electric energy in the tank circuit is discharged to the laser device.

15 Claims, 9 Drawing Sheets

LASER DEVICE WITH HIGH-VOLTAGE PULSE GENERATOR, HIGH-VOLTAGE PULSE GENERATOR AND PULSE GENERATING METHOD

BACKGROUND OF THE INVENTION

The present invention relates to a laser device with a high-voltage pulse generator and to a high-voltage pulse generator and pulse generating method which are most suitable for use with a laser device or discharge-type load.

Laser devices of the transversely excited atmospheric pressure (TEAP) type have required high-voltage pulses of a short rise time. In the past, a pulse generating circuit of this type has been disclosed in JP-A No. 60-96182 filed in Japan on Sept. 28, 1984 claiming the priority on the basis of Ser. No. 3335690.4 filed in West Germany on Sept. 30, 1983. This pulse generating circuit is designed so that one of two parallelly charged capacitors is discharged through an inductance to invert the voltage of the discharged capacitor and combine it with the voltage of th other capacitor thereby producing a voltage which is two times the charged voltage and also a saturable reactor is saturated to take out as an output the electric energy stored in the capacitors. Thus, there is a need for a large-capacity switching element capable of switching at a time about half the electric energy to be outputted during the discharging of said one capacitor. Moreover, the capacity of the switching element or the saturable reactor is increased in inverse proportion to the rise time of the output pulse. Also, while the number or capacity of the following stages in the pulse generating circuit may be increased to decrease the capacity of the switching element, this method has the disadvantage of increasing the numbers of the capacitors and the saturable reactors and increasing the size of the pulse generating circuit with the resulting increase in the cost and the like.

SUMMARY OF THE INVENTION

With a view to overcoming the foregoing deficiencies in the prior art, it is an object of the present invention to provide a pulse generator capable of generating high-voltage pulses with small-capacity switching elements and a pulse generating method, and a laser device equipped with such pulse generator.

To accomplish the above object, in accordance with the invention there is thus provided a pulse generator including switches connected to a primary winding of a transformer, a resonant circuit (tank circuit) including a capacitor connected in parallel with a secondary winding of the transformer, and a saturable reactor for controlling the transmission of an electric energy stored in the resonant circuit to an output.

In this pulse generator, the switches connected to the primary winding of, the transformer are opened and closed a plural number of times in synchronism with the electric oscillation of the resonant circuit on the transformer secondary side so that the electric energy stored in the resonant circuit is increased and the saturable reactor is saturated by the voltage of the resonant circuit, thus outputting the electric energy stored in the resonant circuit and thereby causing the output capacitor to generate a high-voltage pulse having a short rise time and a large energy. In other words, although the electric energy controlled by the primary winding is small, this electric energy is stored a plural number of times in the resonant circuit and eventually the electric energy which is generated which is several tens times the electric energy controlled by the primary winding. Thus, the capacity of the primary-side switching elements is reduced thereby simplifying the utilization of switching semiconductor elements and the switching of the large energy is effected by the saturable reactor with the resulting increased size and increased life for the device.

Other objects of the invention will become apparent from the following description of preferred embodiments taken in conjunction with the accompanying drawings.

DESCRIPTION OF THE PREFERRED EMBODIMENTS

Figure 1:
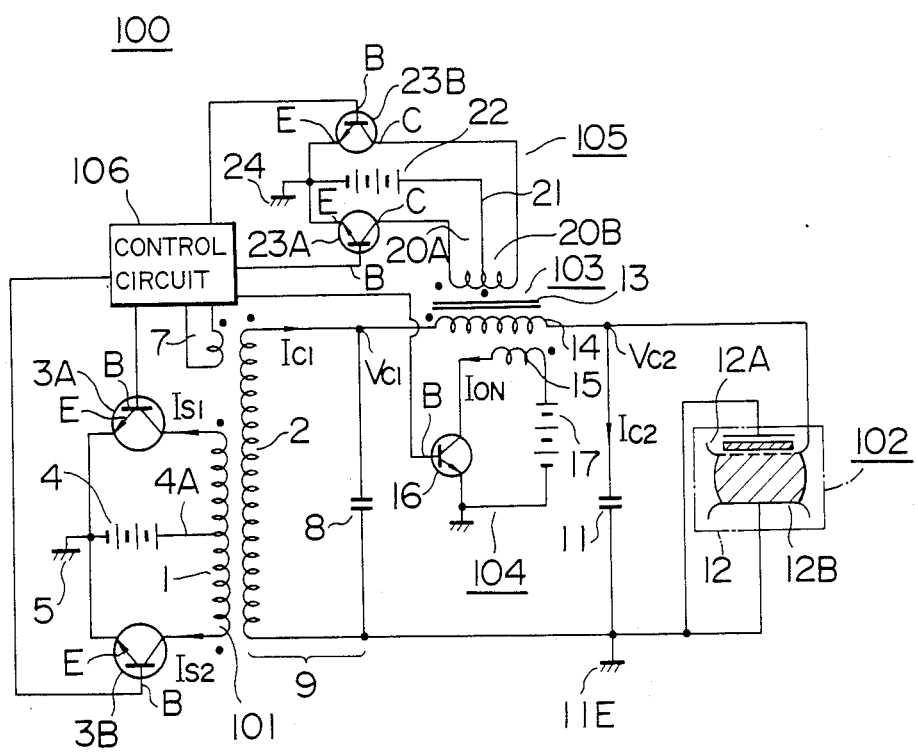
FIG. 1 is a circuit diagram of a pulse generator for lasers according to an embodiment of the invention.

A first embodiment of a pulse generator according to the invention will be described with reference to FIG. 1.

The pulse generator, designated generally at numeral 100, is connected to a laser device 102 from an LC resonant circuit 9 on the secondary side of a transformer 101 through a saturable reactor 103. A timing circuit 104 and a reset circuit 105 are arranged on the secondary side of the saturable reactor 103 and these circuits are also connected to a control circuit 106. One side of the control circuit 106 is connected to the bases B of transistors 3A and 3B which are connected to the primary winding of the transformer 101.

The transformer 101 includes the primary winding 1 and the secondary winding 2. The ends of the primary winding 1 are respectively connected to the collectors of the first and second transistors 3A and 3B forming switching elements. A lead line 4A brought out from the intermediate point of the primary winding 1 between the transistors 3A and 3B is connected to a dc power source 4. One end of the dc power source 4 is connected to the emitters E of the transistors 3A and 3B and a ground 5. The bases B of the transistors 3A and 3B are connected to the control circuit 106. A detecting winding 7, e.g., a current transformer, is connected to the control circuit 106 to detect the direction of current flow in the secondary winding 2. A capacitor 8 is connected between the ends of the secondary winding 2 to form a parallel LC resonant circuit (tank circuit) 9. The LC resonant circuit 9 is connected to an output capacitor 11 and the laser device 102.

The laser device 102 includes a discharge section 12 containing a laser gas and electrodes 12A and 12B, e.g., cathode and anode, arranged within the discharge section 12. The ends of the electrodes 12A and 12B are connected in parallel with the output capacitor 11. The electrodes 12A and 12B and one end of the output capacitor 11 are connected to a ground 11E. The saturable reactor 103 is connected in series with one side of the electrodes 12A and 12B and the output capacitor 11 and the LC resonant circuit 9, respectively.

The saturable reactor 103 includes an iron core, e.g., ring core 13, and a main winding 14 wound on the ring core 13, and the ends of the main winding 14 are respectively connected to the LC resonant circuit 9 and the output capacitor 11, etc. The timing circuit 104 and the reset circuit 105 are arranged on the secondary side (control windings) of the saturable reactor 103.

The timing circuit 104 includes a control winding 15 wound on the core 13, a transistor 16 and a dc power source 17.

The reset circuit 105 includes a pair of windings 20A and 20B which are wound on the core 13. A branch line 21 is brought out from between the windings 20A and 20B and connected to one end of a dc power source 22. The negative terminal of the dc power source 22 and one of the ends of the windings 20A and 20B are respectively connected to the emitters E and collectors C of transistors 23A and 23B. The emitters E are connected to a ground 24.

The bases B of the transistors 16, 23A and 23B are connected to the control circuit 106.

Next, the operation of the pulse generator 100 will be described with reference to FIG. 2.

Figure 2:
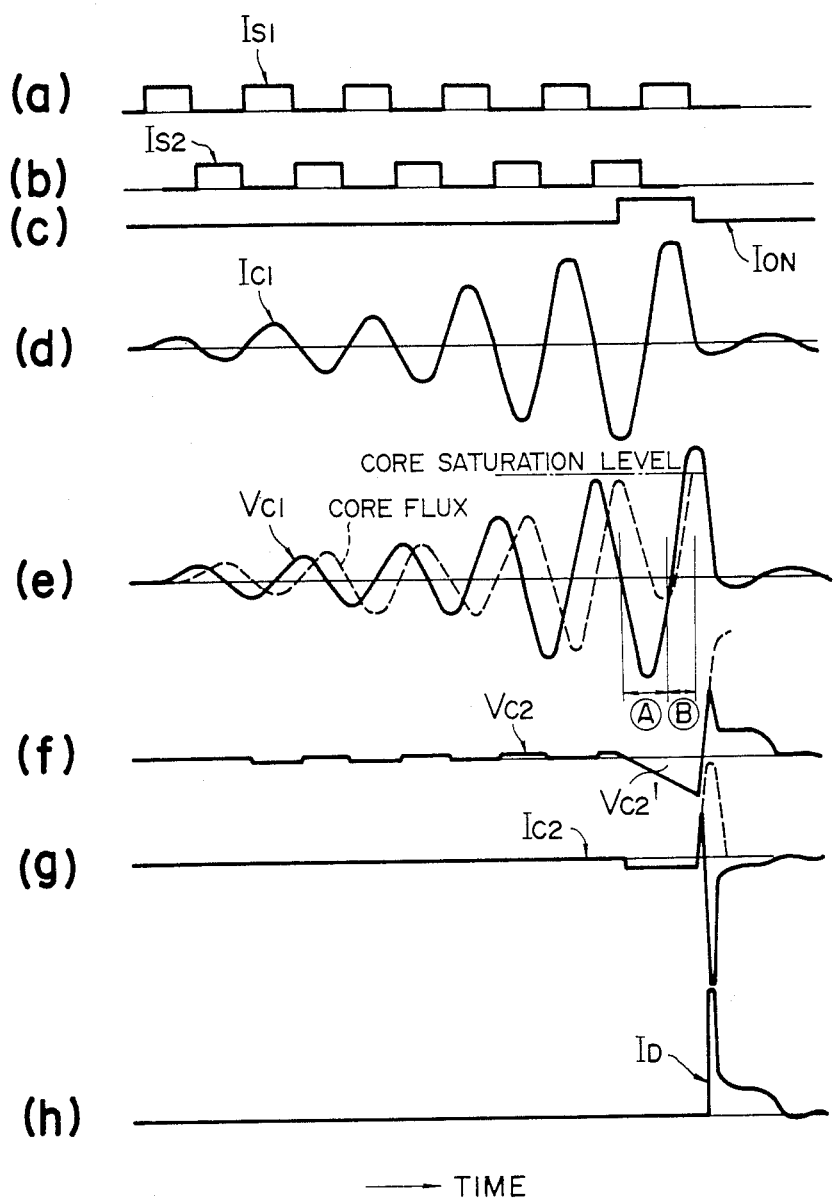
FIGS. 2(a) to (h) show a plurality of signal waveforms generate at various circuit locations of FIG. 1.

When the first transistor 3A is turned on by the drive signal from the control circuit 106, a current $I_{s1}$ such as shown in (a) of FIG. 2 flows to the primary winding 1 from the dc power source 4. In (a) to (h) of FIG. 2, the abscissa represents the time t. The current $I_{s1}$ induces a voltage in the secondary winding 2 electromagnetically coupled to the primary winding 1, thereby causing the flow of a current $I_{c1}$ such as shown in (d) of FIG. 2. The capacitor 8 is connected in parallel with the secondary winding 2 to form the LC resonant circuit 9. The secondary current $I_{s1}$ produces a secondary voltage $V_{c1}$ as shown in (e) of FIG. 2. The detecting winding 7 detects the reversal of the current $I_{c1}$ in the LC resonant circuit 9 to turn the first transistor 3A off and the second transistor 3B on through the control circuit 106. When this occurs, a current $I_{s2}$ flows as shown in (b) of FIG. 2. The resulting voltage induced in the secondary winding 2 by the current $I_{s2}$ is opposite in polarity to the induced voltage by the current $I_{s1}$. As will be seen from FIG. 2(d), the current $I_{c1}$ increases in magnitude each time it reverses. In this way, by turning the first and second transistors 3A and 3B on and off in synchronism with the oscillation period of the LC resonant circuit 9, an electric energy is injected into the LC resonant circuit 9 and the oscillating circuit and voltage are increased. In other words, the electric energy stored in the LC resonant circuit 9 is increased.

On the other hand, as far long as the core 13 is not saturated, the main winding 14 of the saturable reactor 103 has a large inductance and thus a large impedance is presented to the oscillating voltage of the LC resonant circuit 9. As a result, practically no voltage appears across the capacitor 11. On the other hand, the magnetic flux within the core 13 varies as shown by the dotted line in (e) of FIG. 2 in proportion to a time-integrated value of the voltage applied to the winding 14. With respect to the saturable reactor 103, the cross-sectional area of its core 13 and the number of turns of its winding 14 are preset to such values that the saturable reactor 103 is does not become saturated until the voltage $V_{c1}$ of the LC resonant circuit 9 exceeds the desired value. As a result, the saturable reactor 103 is not saturated irrespective of the time it takes until the voltage of the LC resonant circuit 9 attains and exceeds a desired value corresponding to the core saturation level.

In other words, there is no restriction to the time required for storing the desired voltage energy in the LC resonant circuit 9. It is only necessary that an electric energy to be supplied to the LC resonant circuit 9 by each switching of the first and second transistors 3A and 3B exceeds of the loss (including the iron loss in the saturable reactor) due to each oscillation of the LC resonant circuit 9 which is sufficiently small as compared with an electric energy which is to be finally stored in the LC resonant circuit 9. To store a large energy in the resonant circuit in a short time, it is necessary to use large-capacity switching elements for the purpose of increasing an energy to be supplied by every switching. Conversely, when such energy is to be stored in a long period of time, the capacities of the elements can be made smaller.

Therefore, the capacities of the first and second transistors 3A and 3B can e made small enough as compared with the case of the conventional method of supplying about one half of an electric energy to be supplied by every switching.

When the voltage of the LC resonant circuit 9 attains the desired value, the transistor 16 is turned on and a current $I_{ON}$ such as shown in (c) of FIG. 2 flows to the control winding 15 from the dc power source 17. The corresponding current ($I_{c2}$) to the current $I_{ON}$ flows to the main winding 14 so that the capacitor 11 is charged and a voltage $V_{c2'}$ is generated as shown in (f) of FIG. 2. The core 13 is saturated by the voltage $V_{c2'}$ so that the inductance of the winding 14 is decreased and the impedance is reduced. When this occurs, the charge stored in the capacitor 8 is discharged and the current $I_{c2}$ flows as shown in (g) of FIG. 2. When the voltage applied to the capacitor 11 is increased thus reaching the voltage for initiating the discharge of the laser device 102, the impedance of the discharge section 12 is decreased rapidly and the charges are discharged from the capacitors 8 and 11 to the discharge section 12. Thus, a current $I_D$ combining the currents from the capacitors 8 and 11 is supplied to the laser device 102 and it takes the form of a pulse having a rapid positive transition as shown in (h) of FIG. 2.

It is to be noted that to determine the timing of saturation of the saturable reactor 103, the control circuit 106 detects as to whether the voltage of the LC resonant circuit 9 has attained the desired value. The desired number of times of polarity reversal for the current in the secondary winding 2 of the transformer 101 has been preliminarily examined so that the detecting winding 7 detects each polarity reversal and the control circuit 106 counts the number of occurrences. when the count reaches the desired number of times of polarity reversal, the transistor 16 of the timing circuit 104 is turned on. Another method may be used in which the voltage $V_{c1}$ is measured directly by a voltage divider to turn the transistor 16 on when the voltage $V_{c1}$ reaches the desired value.

In this way, the current flowing in the primary winding 1 opens and closes the transistors 3A and 3B so that the LC resonant circuit 9 causes LC resonance to store a large electric energy and this energy is controlled by the saturable reactor 103, thereby outputting a high voltage. Thus, it is only necessary to flow a small current a plurality of times to the primary winding and this permits the use of small-capacity transistors, thereby reducing the size of the pulse generator.

To supply a pulse voltage to the laser device 102, it is necessary that after the desired electric energy has been charged in the LC resonant circuit 9, the core 13 is saturated and the electric energy is transferred to the capacitor 11. In order to transfer the maximum electric energy to the capacitor 11, the core 13 must be saturated at around the maximum voltage value of the capacitor 8. For this purpose, the transistor 16 connected to the control winding 15 is turned on to supply the current $I_{ON}$ from the dc power source 17. The main winding 14 and the control winding 15 from a transformer and thus the current $I_{ON}$ produces a current $I_{c2}$ in the main winding 14, thereby charging the capacitor 11. This voltage is preset lower than the discharge initiating voltage of the laser device 102 and thus there is no danger of discharging the laser device 102.

The voltage $V_{c2}$ charged in the capacitor 11 by the current $I_{ON}$ charges a voltage of the opposite polarity to a voltage which is to be outputted finally. As a result of this, the voltage applied to the main winding 14 is decreased at a half wave (the Ⓐ portion in (e) of FIG. 2) of the opposite polarity to the polarity of the voltage applied to the laser device 102 and thus the amount of change (the amount of decrease in this case) of the magnetic flux in the core is decreased. Also, in the range of the same polarity as the applied voltage (the Ⓑ portion in (e) of FIG. 2), the voltage applied to the main winding 14 is increased and the amount of change of the flux in the core is increased, thereby saturating the core. In other words, the capacitor 11 is charged so that the resulting voltage produces a magnetic flux and this magnetic flux is utilized to saturate the core 13. Thus, the timing of saturating the core 13 can be adjusted in dependence on the magnitude of the voltage on the capacitor 11 or the magnitude of the current $I_{ON}$ flowing in the control winding 15.

By adjusting the timing of saturation of the core 13, a large part of the electric energy stored in the LC resonant circuit 9 is transferred to the output side.

Consequently, by providing the timing circuit 104, the electric energy stored in the LC resonant circuit 9 can be outputted positively at the optimum time instant.

Next, the reset circuit 105 will be described.

More specifically, the voltage $V_{c1}$ of the LC resonant circuit 9 is a voltage which oscillates between positive and negative limits. In accordance with this oscillating voltage, the magnetic flux in the core 13 also oscillates between positive and negative saturation points. Where the initial value of the magnetic flux in the core 13 is reduced to substantially zero, the normal operation is performed. However, the initial value of the magnetic flux in the core 13 is dependent on the preceding discharge of the laser device 102 and it cannot always be near to zero. In other words, after the discharging operation, the residual voltage in the capacitor 11 varies due to variations in the discharge voltage and variations in the discharge time. As a result, variations are caused in the magnetic flux in the core 13 which is varied by the remaining voltage in the capacitor 11.

If the initial value of the magnetic flux in the core 13 deviates from the vicinity of zero, there is the danger of the core 13 being saturated before the electric energy of the LC resonant circuit 9 attaining the desired value and the normal operation is not performed. Therefore, the residual flux of the core 13 must be reset to zero.

For this purpose, in the reset circuit 105 of this invention, the transistor 23A is turned on and the core 13 is saturated. The transistor 23A controls in such a manner that a sufficient time and current for saturating the core 13 in one direction are provided irrespective of the value of the magnetic flux in the core 13. Then, the transistor 23A is turned off and the other transistor 23B is turned on, thereby energizing the core 13 in the reverse direction. When the magnetic flux is reduced to zero, the transistor 23B is turned off.

The necessary current value, voltage value and applying time thereof for reducing the magnetic flux to zero has been determined preliminarily from the magnetic characteristic of the core 13. An induced voltage is charged in the capacitor 11 by the reset current from the control winding 20B. The charged voltage of the capacitor 11 also varies the magnetic flux in the core 13. Therefore, the on period of the transistor 23B for resetting the magnetic flux in the core 13 to zero is selected to have a value sufficient to reduce the total flux including the flux due to the capacitor 11. By so doing, the initial value of the core magnetic flux is always maintained at near to zero so that the saturable reactor 103 is always saturated by a constant voltage-time product and the pulsing operation of the pulse generator is always stabilized.

Referring now to FIGS. 8 to 11A, there are illustrated other embodiments of the reset circuit in the pulse generator according to the invention. In the previously mentioned embodiment of the reset circuit, the resetting is effected by controlling the supply time of the reset current to the control,,.winding The present embodiment features are that the core of the saturable reactor is divided into a plurality of parts and also a single switching element is employed. In accordance with this embodiment, by suitably selecting the cross-sectional area of each split core or by varying the number of turns of the main winding on the split cores, it is possible to control the residual flux to not only zero but also to any given value. In addition, by using two split cores which are saturable in different directions, it is possible to prevent the variation of any magnetic flux by the charged voltage of the output capacitor due to a reset current.

Figure 8A:
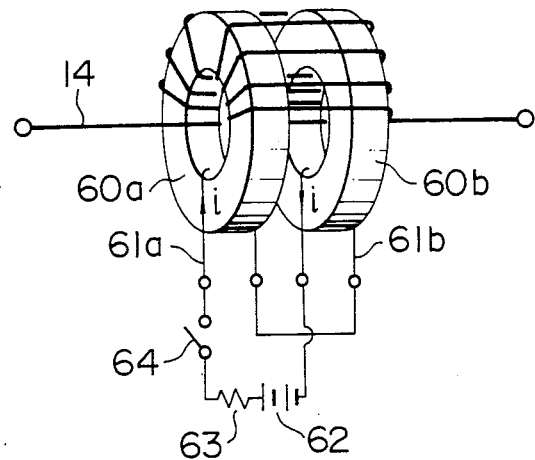
FIG. 8A is a diagram showing an embodiment of the residual flux reset unit suited for use with the pulse generator according to the invention.
Figure 8B:
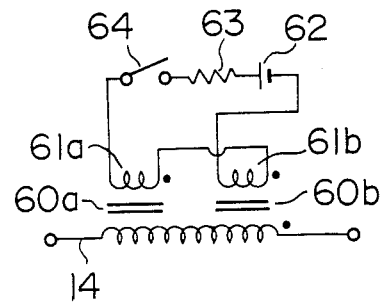
FIG. 8B is a circuit diagram for the resetting unit of FIG. 8A.

FIG. 8A shows the reset circuit according to this embodiment. A saturable reactor includes an iron core splitted into two cores 60a and 60b, a main winding 14 wound to extend over the split cores 60a and 60b, and control windings 61a and 61b which are respectively wound on the split cores 60a and 60b. A dc power source 62, a current controlling resistor 63 and a switch 64 are connected in series with the control windings 61a and 61b. FIG. 8B shows a circuit diagram of the reset circuit. When the switch 64 is closed, the directions of current flow in the control windings 61a and 61b are opposite to each other.

In response to the closing of the switch 64, a current i determined by the voltage of the dc power source 62 and the resistor 63 flows to the control windings 61a and 61b. The current i is preset to a current value sufficient for saturating the split cores 60a and 60b, respectively.

Figure 9:
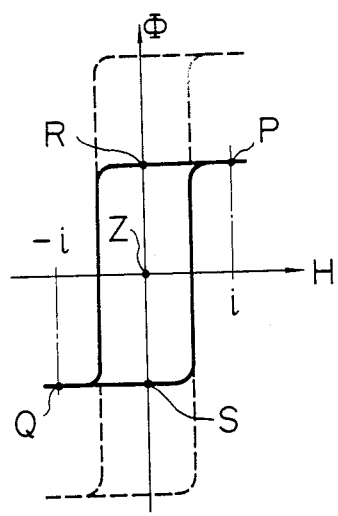
FIG. 9 is a diagram showing magnetic characteristics of the iron cores.

FIG. 9 shows hysteresis curves (the solid lines) of the split cores 60a and 60b. In response to the current i, the magnetic flux in the split core 60a is saturated to P and the magnetic flux in the split core 60b is saturated to Q. When the switch 64 is opened so that the current i is reduced to zero, the residual flux in the split core 60a is reset to R and the residual flux in the split core 60b is reset to S.

The characteristic of the cores on the whole with respect to the main winding 14 is one combining the characteristics of the split cores 60a and 60b and the corresponding hysteresis curve is shown by the dotted line in the Figure. Also, where the characteristics and cross-sectional areas of the split cores 60a and 60b are the same, the residual flux becomes effectively Z or zero.

Consider the operations performed in response to the application of a voltage to the main winding 14. Firstly, when the voltage is applied to the main winding 14 in a direction which increases the magnetic fluxes in the split cores 60a and 60b, the split core 60a is in the saturated state in this direction and the magnetic flux is not increased. On the other hand, as will be seen from FIG. 9, it is possible for the split core 60b to increase the magnetic flux between the points S and P and therefore the magnetic flux is increased in proportion to the applied voltage. This increase in the magnetic flux results in an increase in the inductance of the main winding 14. When a voltage of the opposite polarity is applied, the magnetic flux in the split core 60a is decreased and thus the inductance of the main winding 14 is increased. The results of these operations are the same as the case where the residual fluxes in the split cores 60a and 60b are reset to zero.

The result obtained by thus resetting the residual fluxes in the split cores 60a and 60b to the points R and S of FIG. 9 by the current i flowing in the control windings 61a and 61b is equivalent to resetting the residual fluxes in the split cores 60a and 60b to zero with respect to the main winding 14.

The description has been made of the case where the characteristics and cross-sectional areas of the split cores 60a and 60b are made the same and their residual fluxes are reset to zero. By using the split cores 60a and 60b made of the same material but different in cross-sectional area, the residual flux can be reset to any given value by the same operation as mentioned previously.

Thus, in accordance with the present embodiment, the control windings require only the single control circuit (the power source, switch, etc.). Also, the residual fluxes in the cores can be controlled partially and hence the residual fluxes can be easily reset to any given value.

Figure 10A:
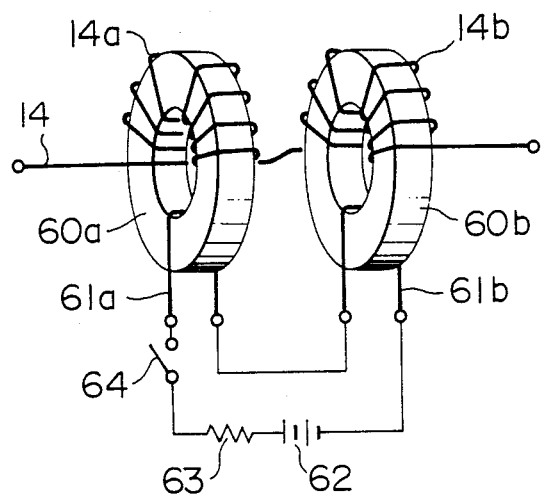
FIG. 10A is a diagram showing another embodiment of the residual flux reset unit.
Figure 10B:
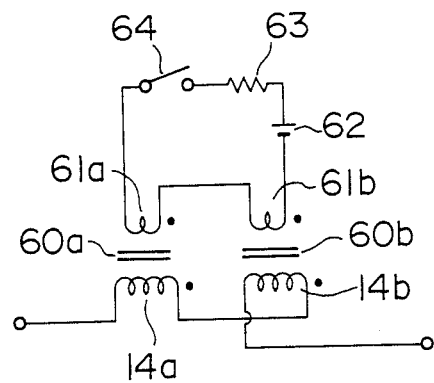
FIG. 10B is a circuit diagram for the resetting unit of FIG. 10A.

Referring now to FIG. 10A, there is illustrated still another embodiment of the reset circuit. In this embodiment, a saturable reactor includes main windings 14a and 14b which are provided separately for split cores 60a and 60b, respectively. The induced electromotive forces to the main windings 14a and 14b are proportional to the varying amounts of magnetic fluxes and the numbers of turns. Thus, by separately adjusting the number of turns in each of the main windings 14a and 14b, it is possible to adjust the value to which the residual fluxes are reset. In other words, by so doing, it is possible to adjust the residual fluxes to be reset in dependence on not only the ratio between the cross-sectional areas but also the ratio between the numbers of turns of the split cores 60a and 60b. Thus, in accordance with this embodiment, the value to which the residual fluxes are to be reset can be adjusted in dependence on the numbers of turns. FIG. 10B shows a circuit diagram for the reset circuit of FIG. 10A.

Figure 11A:
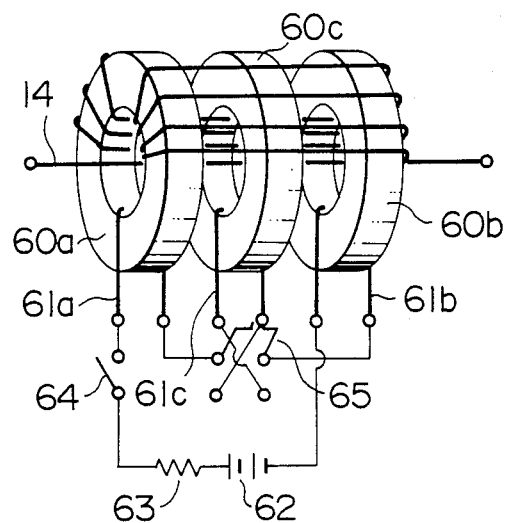
FIG. 11A is a diagram showing still another embodiment of the residual flux resetting unit.
Figure 11B:
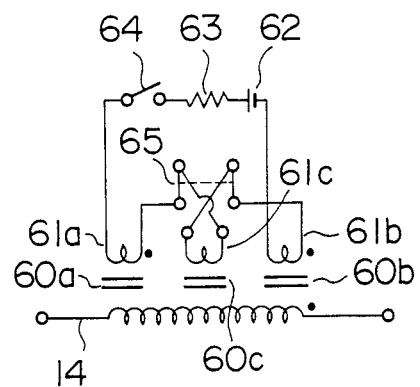
FIG. 11B is a circuit diagram for the resetting unit of FIG. 11A.

FIG. 11A shows still another embodiment of the reset circuit according to the invention. In this embodiment, a saturable reactor core is divided into three split cores 60a, 60b and 60c on which control windings 61a, 61b and 61c are respectively wound. A switch 65 for changing the direction of current flow is connected to the control winding 61c. By operating the switch 65, the direction of saturation of the split core 60c is reversed thereby varying the value to which the residual fluxes are reset. Thus, in accordance with this embodiment, the resulting value of the residual flux can be easily varied by means of the switch 65 connected to the control winding 61c. FIG. 11B shows a circuit diagram of the reset circuit shown in FIG. 11A.

As described hereinabove, the reset circuit of this embodiment can easily reset the residual fluxes in the cores to zero or any other value than the saturation region by use of the simple construction.

While, in the above-described embodiments, the switches 64 and 65 take the form of mechanical switches, it is needless to say that such switching elements as transistors may be used as in the circuit of FIG. 1.

Figure 3:
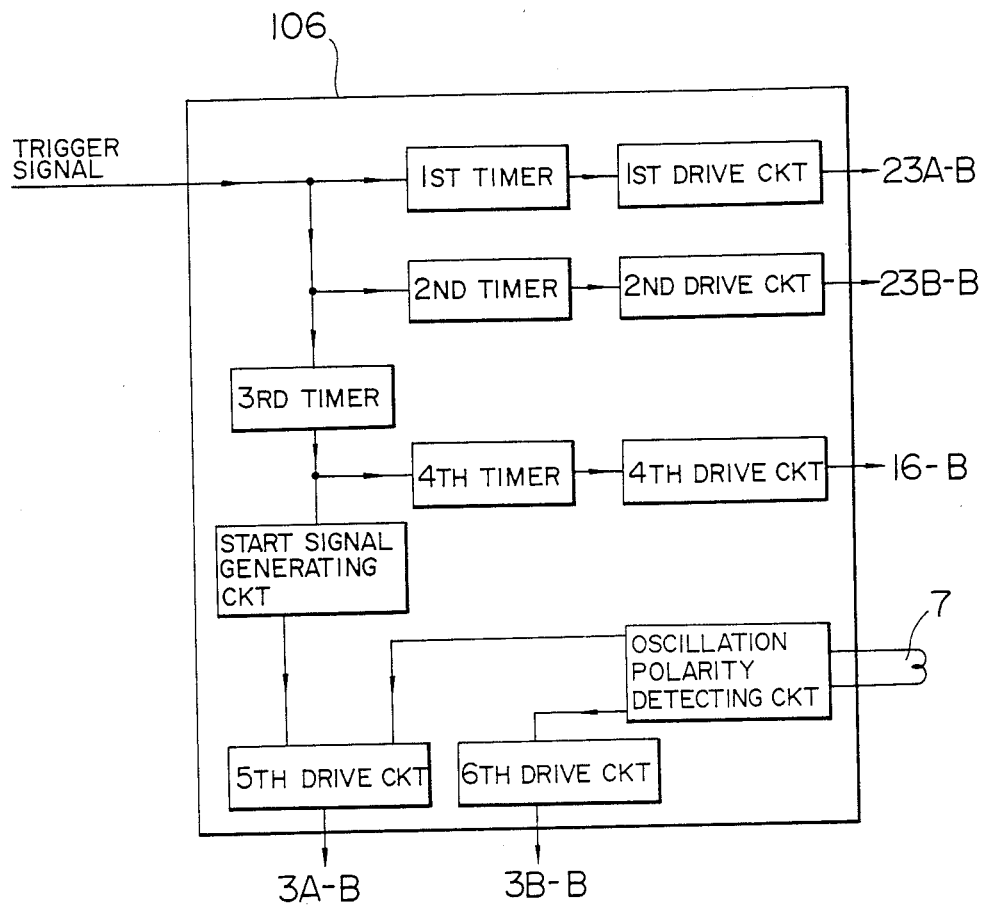
FIG. 3 is a block diagram of the control circuit which is applicable to the pulse generators shown in FIGS. 1, 4 and 5, respectively.

The control circuit 106 of FIG. 1 will now be described in greater detail. FIG. 3 is a block diagram showing an internal construction of the control circuit 106.

In response to an externally applied trigger signal, a first timer is first brought into operation to generate a pulse signal. The pulse signal is amplified by a first driver circuit to turn the transistor 23A on. When this occurs, a current flows to the control winding 20A and the core 13 is saturated. A second timer comes into operation with a delay so that a pulse signal is applied to a second driver circuit and the second drive circuit turns to transistor 23B on. Thus, a current flows to the control winding 20B and the magnetic flux in the core 13 is reset to zero. (The magnetic flux including the effects of the voltages charged in the capacitors 8 and 11 by the induced voltage in the winding 14 is reset to zero.) As a result, the residual flux in the core 13 is reset. Then, a third timer comes into operation and a start signal generating circuit generates a pulse signal. This pulse signal is amplified by a fifth driver circuit to turn the transistor 3A on so that the capacitor 8 is charged by the current $I_{s1}$ in the winding 1 and the resonant circuit 9 starts oscillating (the oscillation of voltage and current). The polarity reversals (oscillations) of the resonant circuit 9 are detected by the detecting winding 7 so that a pulse corresponding to each polarity is generated from an oscillation polarity detecting circuit and the transistors 3A and 3B are alternately turned on and off, thereby increasing the oscillating voltage and current of the resonant circuit 9.

Then, at the expiration of a given time after the reception of the output pulse of the third timer, a fourth timer comes into operation and generates a pulse so that the transistor 16 is turned on and the saturable reactor 103 is saturated, thereby supplying the energy in the resonant circuit 9 to the capacitor 11.

Next, another embodiment of the pulse generator according to the invention will be described with reference to FIG. 4.

Figure 4:
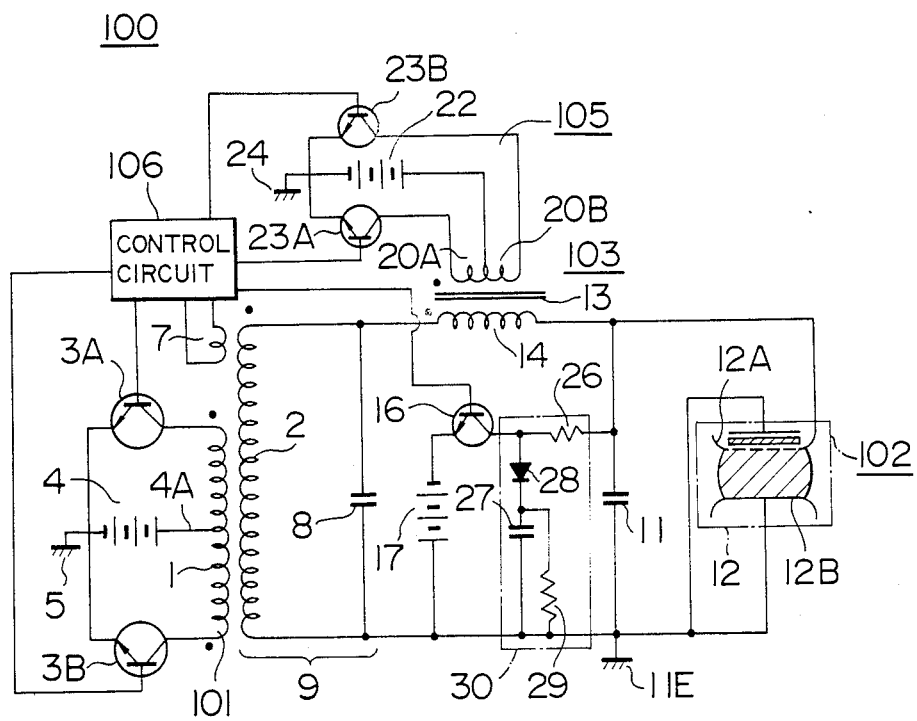
FIGS. 4 to 6 are circuit diagrams showing pulse generators for lasers according to another other embodiments of the invention.

The embodiment of FIG. 4 differs from the embodiment of FIG. 1 in that the capacitor 11 is charged directly from the dc power source 17 by means of the transistor 16. In this circuit, when the electric energy in the capacitor 8 is transferred to the capacitor 11 thereby producing a high voltage, the transistor 16 and the dc power source 17 are protected from the high voltage by a surge absorbing circuit 30 including resistors 26 and 29, a diode 28 and a capacitor 27.

Figure 5:
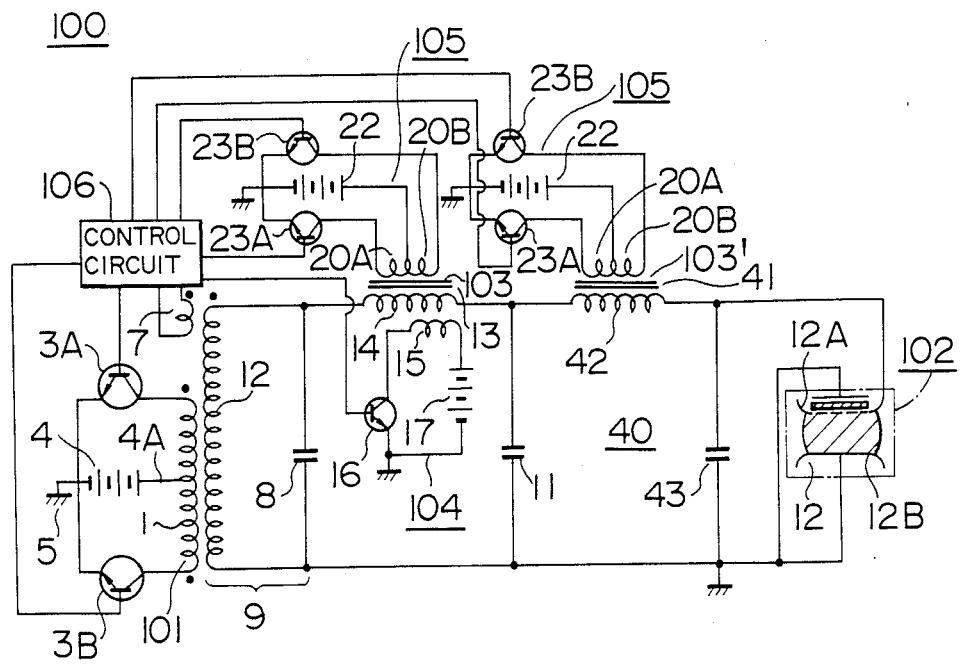

Referring to FIG. 5, there is illustrated still another embodiment of the pulse generator according to the invention, which differs from the embodiment of FIG. 1 in that a magnetic pulse compression circuit 40 is provided between the saturable reactor 103 and the reset circuit 105 and the laser device 102. The magnetic pulse compression circuit 40 includes a saturable reactor 103' and a capacitor 43 and it has the following functions and effects.

In other words, in the previously mentioned timing circuit 104, the current $I_{ON}$ shown in (c) of FIG. 2 is supplied to the main winding 14 so that the capacitor 11 is charged by the current ION and the sawtooth wave $V_{c2'}$ shown in (f) of FIG. 2 is produced, thereby saturating the core 13. If the voltage $V_{c2'}$ is preset near to the discharge voltage so as to saturate the saturable reactor 103 in a short period of time, the danger of the laser device 102 being caused to malfunction due to the voltage $V_{c2'}$ is conceivable.

Thus, in accordance with this embodiment, while the charge in the capacitor 8 is discharged and the discharge current flows to the capacitor 11 when the core 13 is saturated by the voltage $V_{c2}$ thus decreasing the impedance of the main winding 14, a core 41 is not saturated and the discharge is prevented by the saturable reactor 103'. As the time passes so that the potential of the capacitor 11 is increased, the core 41 is saturated so that the charge in the capacitor 11 is discharged and the discharge current flows to the capacitor 43 through a main winding 42. The previously mentioned sawtooth voltage does not appear across the capacitor 43. Thus, only the desired final voltage is applied to the laser device 102, thereby preventing any malfunction. The other parts of the circuit and the same in operation with their counterparts of FIG. 1 and their explanation will be omitted.

Figure 6:
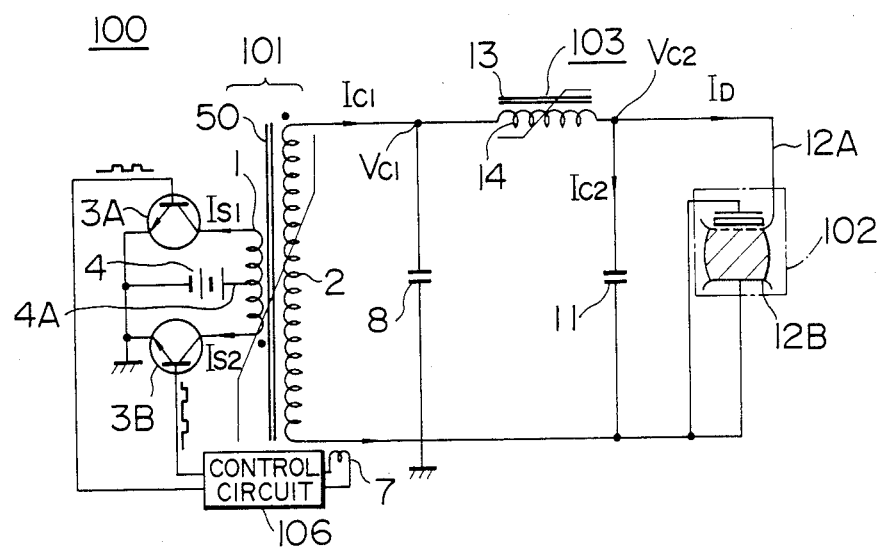

Referring to FIG. 6, there is illustrated still another embodiment of the pulse generator according to the invention which differs from the embodiment of FIG. 1 in that a core 50 is arranged between the primary and secondary windings 1 and 2 of the transformer 101. In this embodiment, a resonant circuit is provided by utilizing the reversion of the voltage on the capacitor 8 due to the saturation of the core 50 of the transformer 101.

With the transformer 101, if $Z_1$ represents the product of the saturation flux density $B_1$ and cross-sectional area $A_1$ of the core 50 and the number of turns $N_1$ of the secondary winding 2, the following equation holds $$Z_1 = B_1 \times A_1 \times N_1 \quad (1)$$

With the saturable reactor 103, if $Z_2$ represents the product of the saturation flux density $B_2$ and cross-sectional area $A_2$ of the core 13 and the number of turns $N_2$ of the winding 14, then the following equation holds $$Z_2 = B_2 \times A_2 \times N_2 \quad (2)$$

Then, assume the following conditions of $Z_1$ and $Z_2$ $$Z_1 < Z_2 \quad (3)$$

Thus, the timing circuit 104 of FIG. 1 can be eliminated. The reason for this will now be described.

Figure 7:
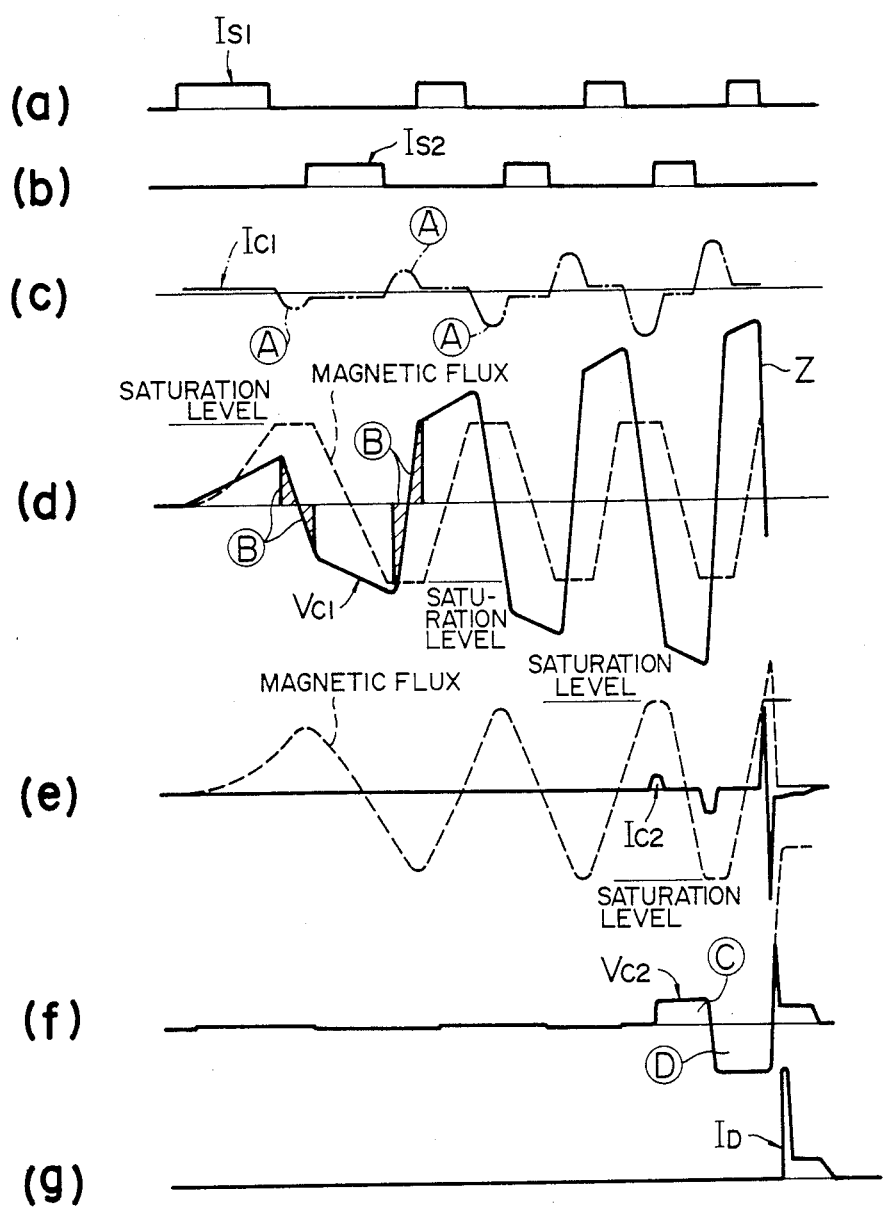
FIGS. 7(a) to (g) show a plurality of signal waveforms genera at various parts locations in the circuit of FIG. 6.

When the transistor 3A is turned on, a current $I_{s1}$ flows to the primary winding 1 wound on the core 50 from the dc power source 4 as shown in (a) of FIG. 7. Since the primary and secondary windings 1 and 2 are magnetically coupled through the core 50 thus forming the transformer 101, the current $I_{s1}$ causes the flow of a current $I_{c1}$ in the secondary winding 2 as shown in (c) of FIG. 7. The current $I_{c1}$ flows to the capacitor 8 thereby producing a voltage $V_{c1}$ on the capacitor 8 as shown in (d) of FIG. 7. The voltage $V_{c1}$ increases the magnetic flux in the core 50 to vary as shown by the dotted line in (d) of FIG. 7. The voltage $V_{c1}$ is also applied to the winding 14 so that the magnetic flux in the core 13 is also increased to vary as shown in (e) of FIG. 7. Then, since the voltage-time products for transformer 101 and the saturable reactor 103 have been preset to become $Z_1 < Z_2$ as shown by equation (3), the core 50 is saturated first and the inductance of the secondary winding 2 is decreased. The charge in the capacitor 8 is discharge through the secondary winding 2 at a frequency determined by the decreased inductance and the capacitance of the capacitor 8 and a half cycle of the discharge current ( Ⓐ in (c) of FIG. 7) flows. As a result, the polarity of the voltage on the capacitor 8 is reversed. When this occurs, the magnetic fluxes in the cores 13 and 50 begin to vary in the reverse direction.

The discharge current $I_{c1}$ Ⓐ of the capacitor 8 is detected by the detecting winding 7 so that the transistor 3A is turned off and the transistor 3B is turned on by the control circuit 106. Consequently, the capacitor 8 is charged in the opposite polarity to previously by the primary winding 1 and the dc power source 4 and its stored electric energy is increased. When the magnetic flux in the core 50 is increased so that the core 50 is eventually saturated, the capacitor 8 is again discharged and the polarity reversal of its voltage is caused. As a result, the on and off states of the transistors 3A and 3B are also reversed thereby charging the capacitor 8.

In this way, the transistors 3A and 3B are turned on and off in accordance with the polarity of the voltage on the capacitor 8 so that the voltage on the capacitor 8 is increased and its electric energy is increased.

On the other hand, when the core 50 is saturated so that the capacitor 8 is discharged through the secondary winding 2 and its voltage polarity is reversed, the voltage in this interval ( Ⓑ (hatched portion) in (d) of FIG. 7) has no effect on the increase and decrease of the magnetic flux in the core 50 but the magnetic flux in the core 13 is varied. In order words, the voltage a longer interval corresponding to the voltage-time products during this interval is additionally applied to the winding 14. Then, the voltage-time product due to this voltage is increased in proportion to the voltage charged in the capacitor 8. When the voltage-time product is increased so that is becomes greater than the difference between the voltage-time product ($Z_1$) of the transformer 101 and the voltage-time product ($Z_2$) of the saturable reactor 103, the core 13 is also saturated.

When the core 13 is saturated, the inductance of the winding 14 is decreased so that a part of the charge in the capacitor 8 is transferred to the capacitor 11 at a frequency determined by the decreased inductance, the capacitor 8 and the capacitor 11. In other words, the current $I_{c2}$ shown in (e) of FIG. 7 flows to the capacitor 11 to produce a voltage $V_{c2}$ (shown in (f) of FIG. 7) thereon. During the next half cycle, this voltage (ⓒ in (f) of FIG. 7) acts to further saturate the core 13 so that when the core 13 is saturated next, a higher reverse polarity voltage (ⓓ in (f) of FIG. 7) is produced and eventually a part of the charge in the capacitor 8 is transferred to the capacitor 11. In other words, the desired voltage and current are obtained. The operations such as the discharge of the laser device when the desired voltage is achieved are the same as in the case of FIG. 1 and will not be described here.

From the foregoing description it will be seen that in accordance with the present invention, by connecting the core 50 to the secondary winding 2 and presetting to hold the following $$Z_1 < Z_2$$

where $Z_1$ represents the voltage-time product of the core 50 and $Z_2$ represents the voltage-time product of the saturable reactor 103 formed by the core 13 and the winding 14, there is no need to use any switching element for saturating the core 13. Also, the primary and secondary windings 1 and 2 are electromagnetically coupled through the core and thus the capacitor 8 can be charged efficiently.

Further, the voltage waveform Z appearing on the capacitor 8 has a rectangular waveform and thus the electric energy of the output voltage is substantially constant even if the timing of saturating the saturable reactor 103 is varied more or less.

We claim:

1. A laser device comprising:
   laser generating means including discharge electrodes;
   a dc power source;
   switching means for switching on and off a voltage from said power source;
   a transformer including a primary winding and a secondary winding, said primary winding being connected to said switching means;
   a tank circuit in the form of a parallel connected inductance-capacitance circuit including the secondary winding of said transformer and a capacitor connected to both ends of said secondary winding, whereby when said switching means is operating it switches on and off the voltage from said dc power source at an oscillation period of said tank circuit such that in response to repeated switching by said switching means electric energy from said dc power source is stored in said tank circuit as a resonance condition build-up of a predetermined value;
   a saturable reactor having a main winding is connected to said tank circuit; and
   an output capacitor connected between said saturable reactor and the discharge electrodes of said laser generating means, whereby when said main winding of said saturable reactor is energized in accordance with said tank circuit attaining a predetermined stored resonance condition, the electric energy stored in said tank circuit is stored in the from of a charge energy and said charge energy is discharged as a pulse to said discharge electrodes.

2. A pulse generator for supplying high-voltage pulses to a discharge-type load comprising:
   a dc power source;
   switching means for switching on and off a voltage from said dc power source;
   a transformer including a primary winding and a secondary winding, said primary winding being connected to said switching means;
   a tank circuit in the form of a parallel connected inductance-capacitance circuit including the secondary winding of said transformer and a capacitor connected to both ends of said secondary winding, whereby when said switching means is operating it switches on and off the voltage from said dc power source at an oscillation period of said tank circuit such that in response to repeated switching by said switching means electric energy from said dc power source is stored in said tank circuit as a resonance condition build-up of a predetermined value;
   a saturable reactor having a main winding connected to said tank circuit; and
   an output capacitor connected between said saturable reactor and said discharge-type load whereby when said main winding of said saturable reactor is energized in accordance with said tank circuit attaining a predetermined stored resonance condition, the electric energy stored in stored in said tank circuit is charged in the form of a charge energy and said charge energy is discharged as a pulse to said discharge-type load.

3. A pulse generator for supplying high-voltage pulses to a discharge type load comprising:
   a dc power source;
   switching means for switching on and off a voltage from said dc power source;
   a transformer including a primary winding and a secondary winding, said primary winding being connected to said switching means;
   a tank circuit in the form of a parallel connected inductance-capacitance circuit including the secondary winding of said transducer and a capacitor connected to both ends of said secondary winding, whereby when said switching means is operating it switches on and off the voltage from said dc power source at an oscillation period of said tank circuit such that in response to repeated switching by said switching means electric energy from said dc power source is stored in said tank circuit as a resonance condition build-up of a predetermined value;
   a saturable reactor having a main winding connected to said tank circuit and control windings;
   an output capacitor connected between said saturable reactor and said discharge-type load, whereby when said main winding of said saturable reactor is energized in accordance with said tank circuit attaining a predetermined stored resonance condition, the electric energy stored in said tank circuit is charged in the form of a charge energy and said charge energy is discharged as a pulse to said discharge-type load; and magnetic flux rest means for supplying a current to said control windings of said saturable reactor to substantially remove a residual flux in said saturable reactor.

4. A pulse generator for supplying high-voltage pulses to a discharge-type load comprising:

a dc power source;

switching means for switching on and off a voltage from said dc power source;

a transformer including a primary winding and a secondary winding, said primary winding being connected to said switching means;

a tank circuit in the form of a parallel connected inductance-capacitance circuit including the secondary winding of said transformer and a capacitor connected to both ends of said secondary winding, whereby when said switching means is operating it switches on and off the voltage from said dc power source at an oscillation period of said tank circuit such that in response to repeated switching by said switching means electric energy from said dc power source is stored in said tank circuit as a resonance condition build-up of a predetermined value;

a saturable reactor having a main winding connected to said tank circuit and control windings;

an output capacitor connected between said saturable reactor and said discharge-type load, whereby when said main winding of said saturable reactor is energized in accordance with said tank circuit attaining a predetermined stored resonance condition, the electric energy stored in said tank circuit is charged in the form of a charge energy and said charge energy is discharged as a pulse to said discharge-type load; and magnetic flux reset means for reducing residual magnetic flux in said saturable reactor to substantially zero including said control windings wound on said saturable reactor, a second dc power source and second switching means connected between said second power source and said control windings for changing the direction of current flow between said second dc power source and said control windings, said reset means reducing the residual magnetic flux as a result of oppositely directioned currents flowing between said second dc power source and said control windings via the switching action of said second switching means.

5. A pulse generator according to claim 4, wherein said control windings of said magnetic flux reset means includes two windings, wherein said second switching means includes two transistors, and wherein each of said transistors is connected in series with said control windings and said second dc power source such that the directions of current flow in said control windings are opposite to each other.

6. A pulse generator according to claim 4, wherein said saturable reactor includes at least two split cores magnetically coupled with each other, wherein said magnetic flux reset means includes at least two control windings each one being wound on a respective one of said split cores, and wherein a current is supplied to at least one of said control windings to saturate said one split core in the opposite direction to that of the other of said control windings.

7. A pulse generator according to claim 6, wherein the main winding of said saturable reactor is wound with a given number of turns on each of said split cores.

8. A pulse generator according to claim 6, wherein a switch is connected to at least one of the control windings of said saturable reactor to selectively change the direction of current flow therein to either the same direction or the opposite direction to the direction of current flow in the other of said control windings.

9. A pulse generator according to claim 2, further comprising a saturation timing control circuit for controlling the timing of energizing said saturable reactor.

10. A pulse generator according to claim 9, wherein said saturation timing control circuit includes a control winding provided on said saturable reactor, and current control means for supplying a current to said control winding to saturate said saturable reactor.

11. A pulse generator according to claim 10, wherein said current control means of said saturation timing control circuit includes counting means for counting the number of times of polarity reversal of the voltage across the secondary winding of said transformer, and a current generating circuit responsive to the counting of a predetermined number of times by said counting means to supply to said control winding a current for saturating said saturable reactor.

12. A pulse generator according to claim 9, wherein said saturation timing control circuit includes counting means for counting the number of times of polarity reversal of the voltage across the secondary winding of said transformer, and a charging circuit responsive to the counting of a predetermined number of times by said counting means to charge said output capacitor and thereby saturate said saturable reactor.

13. A pulse generator according to claim 2, wherein said transformer includes an iron core, and wherein the following relation is satisfied $$B_1 \times A_1 \times N_1 < B_2 \times A_2 \times N_2$$

wherein $B_1$ represents a saturation flux density of said iron core, $A_1$ represents a cross-sectional area of said iron core, $N_1$ represents the number of turns in said secondary winding, $B_2$ represents a saturation flux density of the core of said saturable reactor, $A_2$ represents a cross-sectional area of said core, and $N_2$ represents the number of turns in saturable main winding.

14. A pulse generator according to claim 2, further comprising a second saturable reactor connected in series between said saturable reactor and said discharge-type load, and a second output capacitor connected in parallel with said discharge-type load.

15. A high-voltage pulse generating method for a discharge-type load comprising the steps of:

switching on and off a supply voltage of a dc power source;

supplying an electric energy of said supply voltage switched on and off to a tank circuit through a transformer, said supply voltage being switched on and off in synchronism with an oscillation frequency of said tank circuit;

storing said electric energy supplied to said tank circuit as a resonance condition build-up in accordance with the synchronized switching of said supply voltage to the oscillation frequency of said tank circuit; and discharging said electric energy stored in said tank circuit to said discharge-type load when said stored electric energy resonance condition build-up reaches a predetermined value.

* * * * *